(12) United States Patent
Kim et al.

(10) Patent No.: US 8,685,272 B2
(45) Date of Patent: Apr. 1, 2014

(54) COMPOSITION FOR ETCHING SILICON OXIDE LAYER, METHOD FOR ETCHING SEMICONDUCTOR DEVICE USING THE SAME, AND COMPOSITION FOR ETCHING SEMICONDUCTOR DEVICE

(75) Inventors: Go-Un Kim, Uiwang-si (KR); Hyo-San Lee, Suwon-si (KR); Myung-Kook Park, Uiwang-si (KR); Ho-Seok Yang, Uiwang-si (KR); Jeong-Nam Han, Seoul (KR); Chang-Ki Hong, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 427 days.

(21) Appl. No.: 12/461,319

(22) Filed: Aug. 7, 2009

(65) Prior Publication Data
US 2010/0035436 A1 Feb. 11, 2010

(30) Foreign Application Priority Data

Aug. 8, 2008 (KR) .................. 10-2008-0077984
Jul. 10, 2009 (KR) .................. 10-2009-0063235

(51) Int. Cl.
*C09K 13/08* (2006.01)
*C09K 13/00* (2006.01)
*H01L 21/302* (2006.01)

(52) U.S. Cl.
USPC .................. 252/79.3; 252/79.1; 438/745

(58) Field of Classification Search
None
See application file for complete search history.

(56) References Cited

U.S. PATENT DOCUMENTS

| | | | |
|---|---|---|---|
| 4,585,820 A * | 4/1986 | Defago et al. | 524/232 |
| 5,994,238 A | 11/1999 | Park | |
| 7,176,041 B2 | 2/2007 | Lee et al. | |
| 7,311,857 B2 | 12/2007 | Ko et al. | |
| 7,553,803 B2 | 6/2009 | Korzenski et al. | |
| 8,043,525 B2 | 10/2011 | La et al. | |
| 2002/0063106 A1 * | 5/2002 | Luly et al. | 216/2 |
| 2006/0183297 A1 | 8/2006 | Mun et al. | |
| 2007/0111532 A1 * | 5/2007 | Lee et al. | 438/745 |
| 2008/0003924 A1 * | 1/2008 | Kurata et al. | 451/36 |
| 2008/0152835 A1 * | 6/2008 | Mayers et al. | 427/532 |
| 2008/0184497 A1 * | 8/2008 | Ruch et al. | 8/506 |
| 2009/0023265 A1 | 1/2009 | Mun et al. | |

FOREIGN PATENT DOCUMENTS

| | | |
|---|---|---|
| CN | 1696349 A | 11/2005 |
| CN | 1938415 A | 3/2007 |
| CN | 101131546 A | 2/2008 |
| JP | 2828084 B2 | 9/1998 |
| JP | 2002-534347 A | 10/2002 |
| KR | 10-2005-0037332 A | 4/2005 |
| KR | 10-2005-0106997 A | 11/2005 |
| KR | 10 2005-0109377 A | 11/2005 |
| KR | 10-2006-0045451 A | 5/2006 |

(Continued)

*Primary Examiner* — Shamim Ahmed
*Assistant Examiner* — Bradford Gates
(74) *Attorney, Agent, or Firm* — Lee & Morse, P.C.

(57) ABSTRACT

A composition for etching a silicon oxide layer, a method of etching a semiconductor device, and a composition for etching a semiconductor device including a silicon oxide layer and a nitride layer including hydrogen fluoride, an anionic polymer, and deionized water, wherein the anionic polymer is included in an amount of about 0.001 to about 2 wt % based on the total weight of the composition for etching a silicon oxide layer, and an etch selectivity of the silicon oxide layer with respect to a nitride layer is about 80 or greater.

15 Claims, 1 Drawing Sheet

(56) References Cited

FOREIGN PATENT DOCUMENTS

| KR | 10-2007-0107383 A | 11/2007 |
| WO | WO 00/40518 A1 | 7/2000 |
| WO | WO 2006/054996 A1 | 5/2006 |
| WO | WO 2006/124201 A2 | 11/2006 |
| WO | WO 2006124201 A2 * | 11/2006 |

* cited by examiner

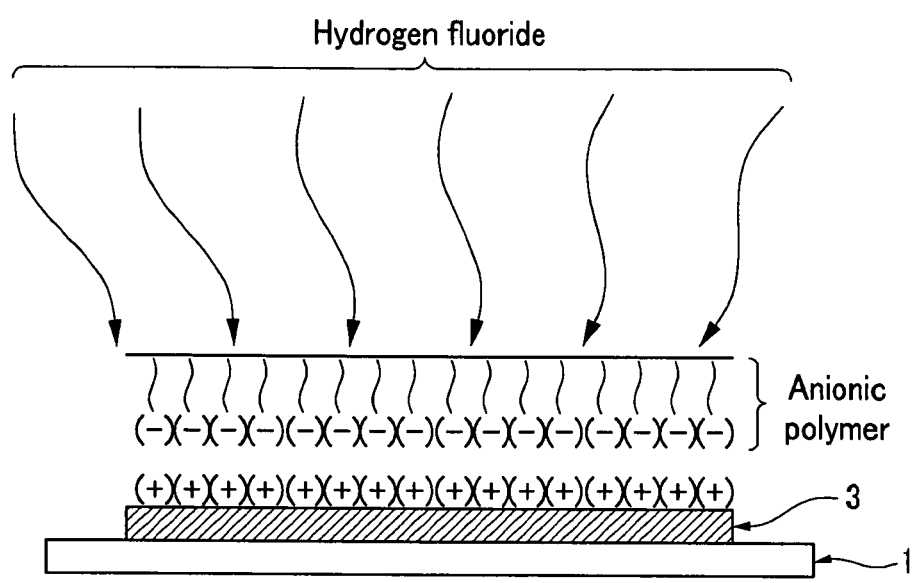

COMPOSITION FOR ETCHING SILICON OXIDE LAYER, METHOD FOR ETCHING SEMICONDUCTOR DEVICE USING THE SAME, AND COMPOSITION FOR ETCHING SEMICONDUCTOR DEVICE

BACKGROUND

1. Field

Embodiments relate to a composition for etching a silicon oxide layer, a method of etching a semiconductor device using the same, and a composition for etching a semiconductor device.

2. Description of the Related Art

Recently, a technique for fabricating a semiconductor device has been developed based on a micro-process technique, and a gap decrease of device isolation layers for isolating devices has drawn attention as a main facet of miniaturization. A silicon oxide layer may be used for providing a pattern and an insulating layer in fabricating an electronic device, e.g., a semiconductor integrated circuit and/or a semiconductor capacitor. A typical method of removing a certain part of the silicon oxide layer may include, e.g., a wet etching process, which may use an etching composition including an etching active main component, e.g., a diluted hydrofluoric acid solution (DHF) or a buffer hydrofluoric acid solution (BHF).

However, as integration of semiconductor integrated circuits and the variety of functions increase, various kinds of layers having totally different etch characteristics may coexist on a semiconductor substrate. For example, a nitride layer on the substrate may include, e.g., a silicon nitride (SiN) layer or titanium nitride (TiN) layer. The silicon nitride layer may be used in various layers having different characteristics, e.g., a HT (high temperature) silicon nitride layer, a LP (low pressure) silicon nitride layer, an ALD (atomic layer deposition) silicon nitride layer, and so on. In addition, an oxide layer on the substrate may include a thermo-oxidative silicon oxide layer, a CVD (chemical vapor deposition)-based silicon oxide layer, e.g., a TEOS (tetra ethyl ortho silicate) layer, a doping-based silicon oxide layer, e.g., BPSG (boron phosphor silicate glass), BSG (boron silicate glass), and so on.

SUMMARY

Embodiments are therefore directed to a composition for etching a silicon oxide layer, a method of etching a semiconductor device using the same, and a composition for etching a semiconductor device, which substantially overcome one or more of the drawbacks, limitations, and/or disadvantages of the related art.

It is a feature of an embodiment to provide a composition for etching a silicon oxide layer in which the etch selectivity of the silicon oxide layer with respect to a nitride layer is improved by decreasing the etch rate of various kinds of nitride layers while maintaining a high etch rate of various silicon oxide layers.

At least one of the above and other features and advantages may be realized by providing a composition for etching a silicon oxide layer including hydrogen fluoride, an anionic polymer, and deionized water, wherein the anionic polymer is included in an amount of about 0.001 to about 2 wt % based on the total weight of the composition for etching a silicon oxide layer, and the composition has an etch selectivity toward the silicon oxide layer with respect to a nitride layer of about 80 or greater.

The hydrogen fluoride may be included in an amount of about 5 to about 90 wt %, based on the total weight of the composition for etching a silicon oxide layer.

The anionic polymer may be included in an amount of about 0.01 to about 1 wt %, based on the total weight of the composition for etching a silicon oxide layer.

The anionic polymer may include at least one of polyacrylic acid, polysulfonic acid, polyacrylamide, a polyacrylamide/acrylic acid copolymer, a polyacrylic acid/sulfonic acid copolymer, a polysulfonic acid/acrylamide copolymer, and a polyacrylic acid/malonic acid copolymer.

The anionic polymer may have a weight average molecular weight (Mw) of about 1,000 to about 1,000,000 g/mol.

The anionic polymer may have a weight average molecular weight (Mw) of about 5,000 to about 100,000 g/mol.

The composition may further include ammonium fluoride.

The ammonium fluoride may be included in an amount of about 0.1 to about 50 wt %, based on the total weight of the composition for etching a silicon oxide layer.

The composition may further include at least one of an organic acid and an inorganic acid, wherein the organic acid includes at least one of acetic acid, citric acid, formic acid, propionic acid, butyric acid, valeric acid, butylacetic acid, enanthic acid, capric acid, and combinations thereof, and the inorganic acid includes at least one of nitric acid, sulfuric acid, hydrochloric acid, phosphoric acid, perchloric acid, and combinations thereof.

The at least one of the organic acid and the inorganic acid may be included in an amount of about 0.1 to about 30 wt %, based on the total weight of the composition for etching a silicon oxide layer.

At least one of the above and other features and advantages may also be realized by providing a method of etching a semiconductor device including etching a layer by one of a batch-type process or a single-wafer-type process, wherein etching the layer includes etching with a composition for etching a silicon oxide layer including hydrogen fluoride, an anionic polymer, and deionized water, wherein the anionic polymer is included in an amount of about 0.001 to about 2 wt % based on the total weight of the composition for etching a silicon oxide layer, and an etch selectivity of a silicon oxide layer with respect to a nitride layer is about 80 or greater.

Etching the layer may include etching a silicon oxide layer including at least one of a thermo oxidative silicon oxide layer, a CVD (chemical vapor deposition)-based silicon oxide layer, and a doping-based silicon oxide layer, and etching a nitride layer including at least one of a silicon nitride (SiN) layer and a titanium nitride (TiN) layer.

The silicon oxide layer may include two or more kinds thereof.

At least one of the above and other features and advantages may also be realized by providing a composition for etching a semiconductor device including a silicon oxide layer and a nitride layer including about 5 to about 90 wt % hydrogen fluoride, based on the total weight of the composition, about 0.001 to about 2 wt % of an anionic polymer, based on the total weight of the composition, and deionized water, wherein the anionic polymer includes at least one of polyacrylic acid, polysulfonic acid, polyacrylamide, a polyacrylamide/acrylic acid copolymer, a polyacrylic acid/sulfonic acid copolymer, a polysulfonic acid/acrylamide copolymer, and a polyacrylic acid/malonic acid copolymer.

BRIEF DESCRIPTION OF THE DRAWING

The above and other features and advantages will become more apparent to those of ordinary skill in the art by describing in detail exemplary embodiments with reference to the attached drawing, in which:

FIG. 1 illustrates a schematic view of a mechanism of etching a nitride layer disposed on a substrate using the composition for etching a silicon oxide layer according to an embodiment.

DETAILED DESCRIPTION

Korean Patent Application Nos. 10-2008-0077984, filed on Aug. 8, 2008, and 10-2009-0063235, filed on Jul. 10, 2009, in the Korean Intellectual Property Office are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing FIGURE, the dimensions of layers and regions may be exaggerated for clarity of illustration. Like reference numerals refer to like elements throughout.

Herein, the term "etch selectivity" represents a value of a silicon oxide layer etch rate divided by a nitride layer etch rate.

According to an embodiment, the composition for protecting a silicon oxide layer may include hydrogen fluoride and an anionic polymer.

The hydrogen fluoride may be used for etching various kinds of oxides and may be included in the composition in an amount of about 5 to about 90 wt %, based on the total weight of the composition for etching a silicon oxide layer. Maintaining the amount of the hydrogen fluoride at about 5 to about 90 wt % may help ensure that an etch selectivity of the silicon oxide layer with respect to the nitride layer is increased. In an implementation, the hydrogen fluoride may be included in an amount of about 10 to about 80 wt %. In another implementation, the hydrogen fluoride may be included in an amount of about 20 to 70 wt %.

An embodiment includes adding a material capable of a negative (−) potential phenomenon into a solution in order to form a weak ionic bond with the surface of a nitride layer using a positive (+) potential phenomenon of zeta potential of the surface of the nitride layer. Since it may be difficult for various kinds of monomer compounds, e.g., a surfactant, to have a (−) potential at a terminal end due to hydrogen fluoride included in the etch compound, a polymer structure may be used. An anionic polymer may be used because it may be the most effective for providing a negative (−) potential phenomenon.

The anionic polymer may protect a surface of various kinds of nitride layers by acting as a stop layer, while not significantly affecting the etch rate of hydrogen fluoride on silicon oxide layers. In other words, the anionic polymer may delay an inflow of hydrogen fluoride onto the nitride layer, so it may be suitable for decreasing the etch rate of the nitride layer.

FIG. 1 illustrates a schematic view showing a mechanism of etching a nitride layer disposed on a substrate using the composition for etching a silicon oxide layer according to an embodiment.

Referring to FIG. 1, the anionic polymer may surround and protect the surface of a nitride layer 3 due to, e.g., high compatibility with the surface of the nitride layer 3 disposed on the substrate 1. Accordingly, the anionic polymer may delay inflow of hydrogen nitride onto the nitride layer 3 to minimize etching of the nitride layer 3.

The anionic polymer may include polymer materials having anionic terminal groups. The anionic polymer may include, e.g., polyacrylic acid, polysulfonic acid, polyacrylamide, a polyacrylamide/acrylic acid copolymer, a polyacrylic acid/sulfonic acid copolymer, a polysulfonic acid/acrylamide copolymer, and/or a polyacrylic acid/malonic acid copolymer. In an implementation, a copolymer including polyacrylic acid may be preferable, and in another implementation, a polyacrylamide/acrylic acid copolymer may be preferable. The anionic polymers of an embodiment may have good solubility in the composition for etching a silicon oxide layer, and may increase the etch selectivity of the various kinds of silicon oxide layers with respect to various kinds of nitride layers.

The weight average molecular weight of the anionic polymer is not specifically limited, but it may be about 1,000 to about 1,000,000 g/mol. Maintaining weight average molecular weight of the anionic polymer at about 1,000 to about 1,000,000 g/mol may help ensure that the solubility of the anionic polymer in the composition for etching a silicon oxide layer is improved, and residue after the etch process is effectively decreased. In an implementation, the weight average molecular weight may be about, 3000 to about 500,000 g/mol. In another implementation, the weight average molecular weight may be about 5,000 to about 100,000 g/mol. Furthermore, when the anionic polymer includes the polyacrylamide/acrylic acid copolymer, it may improve the solubility in the composition for etching a silicon oxide layer if the amount of the acrylamide portion is relatively higher than that of the acrylic acid portion.

The anionic polymer may be included in the composition in an amount of about 0.001 to about 2 wt % based on the total weight of composition for etching a silicon oxide layer. Maintaining the amount of the anionic polymer at about 0.001 to about 2 wt % may help ensure that the solubility of the anionic polymer in the composition for etching a silicon oxide layer is improved. In an implementation, the anionic polymer may be included in an amount of about 0.001 to about 1 wt %. In another implementation, the anionic polymer may be included in an amount of about 0.01 to 1 wt %. In still another implementation, the anionic polymer may be included in an amount of about 0.05 to about 0.5 wt %.

The composition for etching a silicon oxide layer according to an embodiment may further include ammonium fluoride. The ammonium fluoride may increase an etch rate on a CVD (chemical vapor deposition)-based silicon oxide layer, e.g., a TEOS (tetra ethyl ortho silicate) layer. However, ammonium fluoride may decrease the etch rate on a doping-based silicon oxide layer, e.g., a BPSG (boron phosphor silicate glass) layer, a BSG (boron silicate glass) layer, and so on. Accordingly, it may be better to use the ammonium fluoride together with hydrogen fluoride.

An amount of the ammonium fluoride included in the composition may be adjusted depending upon the amount of hydrogen fluoride, the kind of target layer, and the desired etching amount. In an embodiment, the ammonium fluoride may be included in the composition in an amount of about 0.1 to about 50 wt %, based on the total weight of the composition for etching a silicon oxide layer. Maintaining the amount of the ammonium fluoride at about 0.1 to about 50 wt % may help ensure that the etch selectivity of the silicon oxide layer with respect to the nitride layer is increased. In an implementation, the ammonium fluoride may be included in an amount of about 10 to about 30 wt %.

The composition for etching a silicon oxide layer according to an embodiment may further include, e.g., an organic acid and/or inorganic acid. The organic acid may include, e.g., carboxylic acid having a carbon number of about 1 to about 20. In an implementation, the organic acid may include, e.g., acetic acid, citric acid, formic acid, propionic acid, butyric acid, valeric acid, butylacetic acid, enanthic acid, and/or capric acid. The inorganic may include, e.g., nitric acid, sulfuric acid, hydrochloric acid, phosphoric acid, and/or perchloric acid. The organic acid or inorganic acid may be used singularly as two or more kinds thereof, or the organic acid and the inorganic acid may be mixed together.

The organic acid and/or inorganic acid may improve the etch rate on a doping-based silicon oxide layer, e.g., a BPSG layer, a BSG layer, and so on. However, the organic acid or inorganic acid may slightly deteriorate the etch rate on a CVD-based silicon oxide layer, e.g., a TEOS layer.

The organic acid and/or inorganic acid may be included in the composition in an amount of about 0.1 to about 30 wt %, based on the total weight of composition for etching a silicon oxide layer. Maintaining the amount of the organic acid and/or inorganic acid at about 0.1 to about 30 wt % may help ensure that the etch selectivity of the silicon oxide layer with respect to the nitride layer is increased. In an implementation, the organic acid or inorganic acid may be included in an amount of about 0.5 to about 20 wt %. In another implementation, the organic acid or inorganic acid may be included in an amount of about 1 to about 10 wt %.

An etching solution including the composition for etching a silicon oxide layer according to an embodiment may be prepared by, e.g., dissolving an anionic polymer in deionized water to stabilize the composition, and then adding hydrogen fluoride and additional components. The additional components may include, e.g., ammonium fluoride, organic acid, or inorganic acid. Alternatively, hydrogen fluoride and additional components may be dissolved in a solvent, and then the anionic polymer may be added to the resultant solution.

It is possible to etch a semiconductor device including e.g., a silicon oxide layer and a nitride layer, using the composition for etching a silicon oxide layer according to an embodiment in accordance with, e.g., a batch-type method or single-wafer-type method.

The silicon oxide layer may include, e.g., a thermo-oxidative silicon oxide layer, a CVD-based silicon oxide layer such as a TEOS layer, a doping-based silicon oxide layer such as a BPSG layer, a BSG layer, and a mixture thereof, etc.

According to an embodiment, the silicon oxide layer may include two kinds of silicon oxide layers having different etch characteristics. In other words, when the silicon oxide layer is etched using the composition for etching a silicon oxide layer according to an embodiment, it is possible to, e.g., simultaneously etch a thermo-oxidative silicon oxide layer and a CVD-based silicon oxide layer having different etching characteristics; to simultaneously etch a thermo-oxidative silicon oxide layer and a doping-based silicon oxide layer having different etch characteristics; and to simultaneously etch a CVD-based silicon oxide layer and a doping-based silicon oxide layer. According to an embodiment, the composition for etching a silicon oxide layer may simultaneously etch a BPSG layer and a TEOS layer, or simultaneously etch a BSG layer and a TEOS layer.

The nitride layer may include, e.g., a silicon nitride (SiN) layer and/or a titanium nitride (TiN) layer.

When etching with the composition for etching a silicon oxide layer according to an embodiment, it is possible to increase the etch selectivity of the silicon oxide layer with respect to the nitride layer disposed on the semiconductor substrate. According to an embodiment, the etch selectivity of the silicon oxide layer to the nitride layer may be about 80 or more. It may be desirable to have an even higher etch selectivity of the silicon oxide layer to the nitride layer.

Furthermore, when the composition for etching a silicon oxide layer according to an embodiment is simultaneously applied to two or more kinds of silicon oxide layers having different etch characteristics, e.g., a BPSG layer and a TEOS layer, the etch selectivity of the silicon oxide layer with respect to the nitride layer may be maintained at about 80 or more. It is possible to adjust the relative etch selectivity of the BSG layer to the nitride layer, and the etch selectivity of the TEOS layer to the nitride layer, within a reasonable range.

The method of etching a silicon oxide layer according to an embodiment may be used in a method of fabricating a semiconductor device including an etch process that simultaneously etches two or more kinds of silicon oxide layers at a high rate, while preventing a nitride layer from being etched as much as possible.

The following examples illustrate the embodiments in detail. These examples, however, should not in any sense be interpreted as limiting the scope.

PREPARATION EXAMPLES

Preparation Example 1

Based on the total weight of the composition for etching a silicon oxide layer, 39 wt % of hydrogen fluoride, 24 wt % of ammonium fluoride, 5 wt % of nitric acid, and the balance amount of deionized water were mixed to provide an aqueous solution. Then, 0.25 wt % of polyacrylic acid (Geomyung Corporation, F/K #32, weight average molecular weight of 20,000 g/mol), based on the total weight of composition for etching a silicon oxide layer, was added to the aqueous solution to provide a composition for etching a silicon oxide layer.

Preparation Example 2

A composition for etching a silicon oxide layer was prepared in accordance with the same procedure as in Preparation Example 1, except that a polyacrylic acid/sulfonic acid copolymer (Geomyung Corporation, weight average molecular weight of 800,000 g/mol) was added instead of polyacrylic acid, in the same amount.

Preparation Example 3

A composition for etching a silicon oxide layer was prepared in accordance with the same procedure as in Preparation Example 1, except that a polyacrylamide/acrylic acid copolymer (Susan Polymer Co., Ltd., EX 5344, weight average molecular weight of 20,000 g/mol) was added instead of polyacrylic acid in an amount of 0.2 wt %, based on the total weight of the composition for etching a silicon oxide layer.

Preparation Example 4

Based on the total weight of the composition for etching a silicon oxide layer, 20 wt % of hydrogen fluoride, 19.8 wt % of ammonium fluoride, and the balance amount of deionized water were mixed to provide an aqueous solution. Then, 0.1 wt % of a polyacrylamide/acrylic acid copolymer (Susan Polymer Co., Ltd., EX 5344, weight average molecular weight of 20,000 g/mol), based on the total weight of composition for etching a silicon oxide layer, was added to the aqueous solution to provide a composition for etching a silicon oxide layer.

Preparation Example 5

Based on the total weight of the composition for etching a silicon oxide layer, 60 wt % of hydrogen fluoride and the balance amount of deionized water were mixed to provide an aqueous solution. Then, 0.3 wt % of a polyacrylamide/acrylic acid copolymer (Susan Polymer Co., Ltd., EX 5344, weight average molecular weight of 20,000 g/mol), based on the total weight of composition for etching a silicon oxide layer, was added to the aqueous solution to provide a composition for etching a silicon oxide layer.

Comparative Preparation Example 1

A composition for etching a silicon oxide layer was prepared in accordance with the same procedure as in Preparation Example 1, except that a sugar-based material of a polyglycol syrup (Samyang Corporation) was added instead of polyacrylic acid, in the same amount.

Comparative Preparation Example 2

A composition for etching a silicon oxide layer was prepared in accordance with the same procedure as in Preparation Example 1, except that polyacrylic acid was not added.

Comparative Preparation Example 3

A composition for etching a silicon oxide layer was prepared in accordance with the same procedure as in Preparation Example 4, except that a polyacrylic amide/acrylic acid copolymer was not added.

Comparative Preparation Example 4

A composition for etching a silicon oxide layer was prepared in accordance with the same procedure as in Preparation Example 1, except that 0.1 wt % of an anionic surfactant (manufactured by 3M, trade name: 4434), based on the total weight of composition for etching a silicon oxide layer, was added instead of polyacrylic acid.

Examples

Examples 1 to 5 and Comparative Examples 1 to 4

Using each etching composition obtained from Preparation Examples 1 to 5 and Comparative Preparation Examples 1 to 4, a semiconductor device including a silicon nitride layer, a TEOS CVD-based silicon oxide layer, and a BPSG doping-based silicon oxide layer were etched. The removal speed of the silicon oxide layer and the etch selectivity of the silicon oxide layer with respect to the nitride layer were determined. The results are shown in Table 1, below. Products prepared using the compositions according to Preparation Examples 1 to 5 correspond to Examples 1 to 5, and products prepared using the composition according to Comparative Preparation Examples 1 to 4 correspond to Comparative Examples 1 to 4. The etch selectivity represents a value of the silicon oxide layer etch rate divided by the nitride layer etch rate.

TABLE 1

| | Silicon nitride layer etch rate (Å/min) | BPSG layer etch rate (Å/min) | TEOS layer etch rate (Å/min) | BPSG layer/silicon nitride layer etch selectivity | TEOS layer/silicon nitride layer etch selectivity |
| --- | --- | --- | --- | --- | --- |
| Example 1 | 90 | 7924 | 9095 | 88.04 | 101.05 |
| Example 2 | 73 | 7728 | 8406 | 105.8 | 114.7 |
| Example 3 | 40 | 6146.1 | 7405 | 153.7 | 180.1 |
| Example 4 | 52 | 4400 | 16600 | 84 | 320 |
| Example 5 | 95 | 26000 | 9750 | 273.68 | 102.63 |
| Comparative Example 1 | 112.9 | 7379.3 | 8293.4 | 65.5 | 73.5 |
| Comparative Example 2 | 158 | 7720 | 9659 | 48.9 | 61.2 |
| Comparative Example 3 | 140 | 4900 | 19000 | 35 | 136 |
| Comparative Example 4 | 150 | 8002 | 9291 | 53 | 61.94 |

As shown in Table 1, Examples 1 to 5 had a higher relative etch rate for the BPSG layer and the TEOS layer than those of Comparative Examples 1 and 4 in which the kinds of anionic polymers according to an embodiment were not included and those of Comparative Examples 2 and 3 in which no kinds of anionic polymers were included. Examples 1 to 5 also exhibited a lower etch rate for the silicon nitride layer than those of Comparative Examples 1 and 4 and those of Comparative Examples 2 and 3. Accordingly, Examples 1 to 5 exhibited an increased etch selectivity of the silicon oxide layer with respect to the nitride layer.

Particularly, Examples 1 to 5 had an etch selectivity of the silicon oxide layer with respect to the nitride layer of 80 or more. Further, each etch selectivity of silicon oxide layer with respect to the nitride layer was maintained above 80, even in the case of using two or more kinds of silicon oxide layers having different etch characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A composition for etching a silicon oxide layer, consisting of:
   hydrogen fluoride;
   ammonium fluoride;
   an anionic polymer, wherein the anionic polymer includes at least one of polyacrylic acid, polyacrylamide, a polyacrylamide/acrylic acid copolymer, a polyacrylic acid/sulfonic acid copolymer, a polysulfonic acid/acrylamide copolymer, and a polyacrylic acid/malonic acid copolymer;
   an acid, wherein the acid is one of acetic acid, citric acid, formic acid, propionic acid, butyric acid, valeric acid, butylacetic acid, enanthic acid, capric acid, nitric acid, sulfuric acid, hydrochloric acid, phosphoric acid, perchloric acid, and combinations thereof; and
   deionized water, wherein:
   the anionic polymer is included in an amount of about 0.001 to about 2 wt % based on the total weight of the composition for etching a silicon oxide layer, and
   the composition has an etch selectivity toward the silicon oxide layer with respect to a nitride layer of about 80 or greater.

2. The composition for etching a silicon oxide layer as claimed in claim 1, wherein the hydrogen fluoride is included in an amount of about 5 to about 90 wt %, based on the total weight of the composition for etching a silicon oxide layer.

3. The composition for etching a silicon oxide layer as claimed in claim 1, wherein the anionic polymer is included in an amount of about 0.01 to about 1 wt %, based on the total weight of the composition for etching a silicon oxide layer.

4. The composition for etching a silicon oxide layer as claimed in claim 1, wherein the anionic polymer has a weight average molecular weight (Mw) of about 1,000 to about 1,000,000 g/mol.

5. The composition for etching a silicon oxide layer as claimed in claim 4, wherein the anionic polymer has a weight average molecular weight (Mw) of about 5,000 to about 100,000 g/mol.

6. The composition for etching a silicon oxide layer as claimed in claim 1, wherein the ammonium fluoride is included in an amount of about 0.1 to about 50 wt %, based on the total weight of the composition for etching a silicon oxide layer.

7. The composition for etching a silicon oxide layer as claimed in claim 1, wherein the acid is included in an amount of about 0.1 to about 30 wt %, based on the total weight of the composition for etching a silicon oxide layer.

8. The composition for etching a silicon oxide layer as claimed in claim 1, wherein the anionic polymer is a polyacrylamide/acrylic acid copolymer.

9. The composition for etching a silicon oxide layer as claimed in claim 8, wherein an amount of acrylamide in the polyacrylamide/acrylic acid copolymer is relatively higher than an amount of acrylic acid in the polyacrylamide/acrylic acid copolymer.

10. A method of etching a semiconductor device, comprising:
    etching a layer by one of a batch-type process or a single-wafer-type process, wherein etching the layer includes etching with a composition for etching a silicon oxide layer, the composition for etching a silicon oxide layer consisting of:
    hydrogen fluoride;
    ammonium fluoride;
    an anionic polymer, wherein the anionic polymer includes at least one of polyacrylic acid, polyacrylamide, a polyacrylamide/acrylic acid copolymer, a polyacrylic acid/sulfonic acid copolymer, a polysulfonic acid/acrylamide copolymer, and a polyacrylic acid/malonic acid copolymer;
    an acid, wherein the acid is one of acetic acid, citric acid, formic acid, propionic acid, butyric acid, valeric acid, butylacetic acid, enanthic acid, capric acid, nitric acid, sulfuric acid, hydrochloric acid, phosphoric acid, perchloric acid, and combinations thereof; and
    deionized water, wherein:
    the anionic polymer is included in an amount of about 0.001 to about 2 wt % based on the total weight of the composition for etching a silicon oxide layer, and the composition for etching a silicon oxide layer has an etch selectivity of a silicon oxide layer with respect to a nitride layer is about 80 or greater.

11. The method of etching a semiconductor device as claimed in claim 10, wherein etching the layer includes:
    etching a silicon oxide layer including at least one of a thermo oxidative silicon oxide layer, a CVD (chemical vapor deposition)-based silicon oxide layer, and a doping-based silicon oxide layer, and
    etching a nitride layer including at least one of a silicon nitride (SiN) layer and a titanium nitride (TiN) layer.

12. The method of etching a semiconductor device as claimed in claim 11, wherein the silicon oxide layer includes two or more kinds thereof.

13. A composition for etching a semiconductor device including a silicon oxide layer and a nitride layer, consisting of:
    about 5 to about 90 wt % hydrogen fluoride, based on the total weight of the composition;
    about 0.001 to about 2 wt % of an anionic polymer, based on the total weight of the composition;
    about 0.1 to about 50 wt % of ammonium fluoride, based on the total weight of the composition;
    about 0.1 to about 30 wt % of an acid, based on the total weight of the composition, wherein the acid is one of acetic acid, citric acid, formic acid, propionic acid, butyric acid, valeric acid, butylacetic acid, enanthic acid, capric acid, nitric acid, sulfuric acid, hydrochloric acid, phosphoric acid, perchloric acid, and combinations thereof; and
    deionized water,
    wherein the anionic polymer includes at least one of polyacrylic acid, polyacrylamide, a polyacrylamide/acrylic acid copolymer, a polyacrylic acid/sulfonic acid copolymer, a polysulfonic acid/acrylamide copolymer, and a polyacrylic acid/malonic acid copolymer.

14. The composition for etching a semiconductor device including a silicon oxide layer and a nitride layer as claimed in claim 13, wherein the anionic polymer is a polyacrylamide/acrylic acid copolymer.

15. The composition for etching a semiconductor device including a silicon oxide layer and a nitride layer as claimed in claim 14, wherein an amount of acrylamide in the polyacrylamide/acrylic acid copolymer is relatively higher than an amount of acrylic acid in the polyacrylamide/acrylic acid copolymer.

* * * * *